(12) United States Patent
Kitamura

(10) Patent No.: US 8,314,459 B2
(45) Date of Patent: Nov. 20, 2012

(54) SEMICONDUCTOR DEVICE INCLUDING VERTICAL TRANSISTOR AND HORIZONTAL TRANSISTOR

(75) Inventor: Yasuhiro Kitamura, Chiryu (JP)

(73) Assignee: DENSO CORPORATION, Kariya (JP)

( * ) Notice: Subject to any disclaimer, the term of this patent is extended or adjusted under 35 U.S.C. 154(b) by 158 days.

(21) Appl. No.: 12/805,420

(22) Filed: Jul. 30, 2010

(65) Prior Publication Data

US 2011/0068387 A1 Mar. 24, 2011

(30) Foreign Application Priority Data

Sep. 23, 2009 (JP) ................. 2009-218324

(51) Int. Cl.
*H01L 29/66* (2006.01)
(52) U.S. Cl. .................. 257/329; 257/E27.06
(58) Field of Classification Search .................. 257/329, 257/E27.06, E21.19, 220, 242, 501
See application file for complete search history.

(56) References Cited

U.S. PATENT DOCUMENTS

| | | | | |
|---|---|---|---|---|
| 5,578,841 | A * | 11/1996 | Vasquez et al. ............... | 257/220 |
| 2002/0096779 | A1 * | 7/2002 | Feldtkeller et al. ........... | 257/776 |
| 2003/0057532 | A1 * | 3/2003 | Chang et al. .................. | 257/676 |
| 2006/0086449 | A1 | 4/2006 | Nakayama | |
| 2006/0220178 | A1 * | 10/2006 | Kubo et al. ................... | 257/532 |
| 2007/0120265 | A1 | 5/2007 | Fukumi et al. | |
| 2008/0135932 | A1 | 6/2008 | Ozeki et al. | |
| 2009/0057812 | A1 * | 3/2009 | Akagi et al. .................. | 257/506 |
| 2009/0127624 | A1 * | 5/2009 | Sumitomo et al. ............ | 257/350 |

FOREIGN PATENT DOCUMENTS

| | | |
|---|---|---|
| JP | B2-275888 | 1/1998 |
| JP | A-2003-309120 | 10/2003 |

* cited by examiner

*Primary Examiner* — A. Sefer
*Assistant Examiner* — Nikolay Yushin
(74) *Attorney, Agent, or Firm* — Posz Law Group, PLC

(57) ABSTRACT

A semiconductor device includes a semiconductor substrate, a vertical transistor, a horizontal transistor, a lead, wire-bonding pads, and penetrating electrodes. The semiconductor substrate has first and second surfaces and includes a first surface portion adjacent to the first surface. The vertical transistor includes first and second electrodes on the first surface and a third electrode on the second surface. The horizontal transistor includes first, second, and third electrodes on the first surface. The vertical transistor and the horizontal transistor further include PN junction parts in the first surface portion. The lead is disposed to the first surface and is electrically coupled with the first electrode of the vertical transistor. The wire-bonding pads are disposed on the second surface. The second electrode of the vertical transistor and the first to third electrodes of the horizontal transistor are electrically coupled with the wire-boding pads through the penetrating electrodes.

11 Claims, 10 Drawing Sheets

SEMICONDUCTOR DEVICE INCLUDING VERTICAL TRANSISTOR AND HORIZONTAL TRANSISTOR

CROSS REFERENCE TO RELATED APPLICATIONS

The present application is based on and claims priority to Japanese Patent Application No. 2009-218324 filed on Sep. 23, 2009, the contents of which are incorporated in their entirety herein by reference.

BACKGROUND OF THE INVENTION

1. Field of the Invention

The present invention relates to a semiconductor device including a vertical transistor and a horizontal transistor. The present invention also relates to a method of manufacturing the semiconductor device.

2. Description of the Related Art

US 2008/0135932 A (corresponding to JP-A-2008-166705) discloses a semiconductor device in which a semiconductor substrate is divided into a plurality of field areas by a plurality of isolation trenches. In at least one of the field areas, a double-sided electrode element having electrodes on both sides of the semiconductor substrate is formed. In at least another one of the field areas, a single-sided electrode element having a pair of electrodes on one side of the semiconductor substrate is formed. The double-sided electrode element includes a vertical transistor in which electric current flows in a thickness direction of the semiconductor substrate. The single-sided electrode element includes a horizontal transistor in which electric current flows in a direction perpendicular to the thickness direction of the semiconductor substrate, that is, in a direction along a surface of the semiconductor substrate.

In the semiconductor device, electrodes of a plurality of vertical transistors formed on one side of the semiconductor substrate are electrically coupled with each other through a wire, and electrodes of the vertical transistors formed on the other side of the semiconductor substrate are electrically coupled with each other through a wire for forming a circuit by the vertical transistors (see FIG. 6B in US 2008/0135932 A). The circuit can be electrically coupled with an external device by bonding outer wires to pads which are coupled with the wires. In a portion of the semiconductor substrate adjacent to the one side, PN junction parts of the vertical transistors and the horizontal transistors are disposed. Thus, stress during bonding the outer wires may be applied to the PN junction parts, and electric properties of the transistors may change.

For restricting, such a failure, a lead may be coupled with the wires through a die bonding material. However, in this case, the lead needs to be processed so as to correspond to the pads of the wires which are arranged to form the circuit. Thus, the lead is divided and a heat radiation performance of the lead may be reduced. Especially in a case where the vertical transistors form a power section for electric power and the horizontal transistors form a control section for driving the power section, if the heat radiation performance is reduced, heat generated at the power section may be transmitted to the control section, and the control section may malfunction.

SUMMARY OF THE INVENTION

In view of the foregoing problems, it is an object of the present invention to provide a semiconductor device that can restrict a change in electric properties of a transistor and can have a high heat radiation performance. Another object of the present invention is to provide a method of manufacturing the semiconductor device.

A semiconductor device according to an aspect of the present invention includes a semiconductor substrate, a plurality of isolation trenches, a vertical transistor, a horizontal transistor, a sheet of lead, a plurality of wire-bonding pads, and a plurality of penetrating electrodes. The semiconductor substrate has a first surface and a second surface opposing each other in a thickness direction of the semiconductor substrate. The semiconductor substrate includes a first surface portion adjacent to the first surface and a second surface portion adjacent to the second surface. The isolation trenches divide the semiconductor substrate into a plurality of element-forming regions. The vertical transistor is disposed in one of the element-forming regions. The vertical transistor includes a first electrode, a second electrode, and a third electrode. The first electrode and the second electrode are disposed on the first surface and the third electrode is disposed on the second surface so that electric current flows between the first electrode and the third electrode in the thickness direction. The vertical transistor further includes a PN junction part in the first surface portion. The horizontal transistor is disposed in another one of the element-forming regions. The horizontal transistor includes a first electrode, a second electrode, and a third electrode. The first electrode, the second electrode, and the third electrode are disposed on the first surface so that electric current flows between the first electrode and the third electrode in a direction along the first surface. The horizontal transistor further includes a PN junction part in the first surface portion. The sheet of lead is disposed to the first surface and covers the whole area of the first surface. The wire-bonding pads are disposed on the second surface. The penetrating electrodes penetrate the semiconductor substrate in the thickness direction. The first electrode of the vertical transistor is electrically coupled with the sheet of lead. Each of the second electrode of the vertical transistor, the first electrode, the second electrode, and the third electrode of the horizontal transistor is electrically coupled with a corresponding one of the wire-bonding pads through a corresponding one of the penetrating electrodes.

In the semiconductor device, the PN junction parts of the vertical transistor and the horizontal transistor are disposed in the first surface portion adjacent to the first surface of the semiconductor substrate and the wire-bonding pads are disposed on the second surface of the semiconductor substrate. Thus, the PN junction parts are restricted from being applied with a stress during bonding wires to the wire-bonding pads, and a change in electric properties of the vertical transistor and the horizontal transistor can be restricted. Furthermore, in the semiconductor device, the sheet of lead is disposed to the first surface of the semiconductor substrate and covers the whole area of the first surface. Thus, the semiconductor substrate can have a high heat radiation performance.

The semiconductor device can be formed, for example, by a first manufacturing method or a second manufacturing method.

In the first manufacturing method, a plurality of components of the vertical transistor and the horizontal transistor in the first surface portion of the semiconductor substrate is formed. A thickness of the semiconductor substrate is reduced to a predetermined thickness by grinding the semiconductor substrate from the second surface. A plurality of trenches that penetrates the semiconductor substrate from the second surface to the first surface is provided after the reducing the thickness. An insulating layer is formed on a sidewall of each of the trenches. A hollow portion surrounded by the insulating layer is filled with a conductive member. Then, a component of the vertical transistor in the second surface portion of the semiconductor substrate is formed.

In the second manufacturing method, a plurality of trenches is provided from the first surface of the semiconductor substrate to a predetermined depth. An insulating layer is disposed on a sidewall of each of the trenches. A hollow portion is surrounded by the insulating layer on the sidewall of at least one of the trenches with a conductive member. A plurality of components of the vertical transistor and the horizontal transistor in the first surface portion of the semiconductor substrate is formed after the filling the hollow portion. A thickness of the semiconductor substrate is reduced from the second surface so that the plurality of trenches penetrates the semiconductor substrate from the first surface to the second surface. A component of the vertical transistor in the second surface portion of the semiconductor substrate is formed after the reducing the thickness.

BRIEF DESCRIPTION OF THE DRAWINGS

Additional objects and advantages of the present invention will be more readily apparent from the following detailed description of exemplary embodiments when taken together with the accompanying drawings. In the drawings.

DETAILED DESCRIPTION OF THE EXEMPLARY EMBODIMENTS

Semiconductor devices according to exemplary embodiments of the present invention will be described below. Each of the semiconductor devices includes a horizontal metal-oxide-semiconductor field-effect transistor (MOSFET) as an example of a horizontal transistor and a vertical MOSFET as an example of a vertical transistor.

First Embodiment

A semiconductor device 100 according to a first embodiment of the present invention will be described with reference to FIG. 1 to FIG. 5D.

Figure 1:
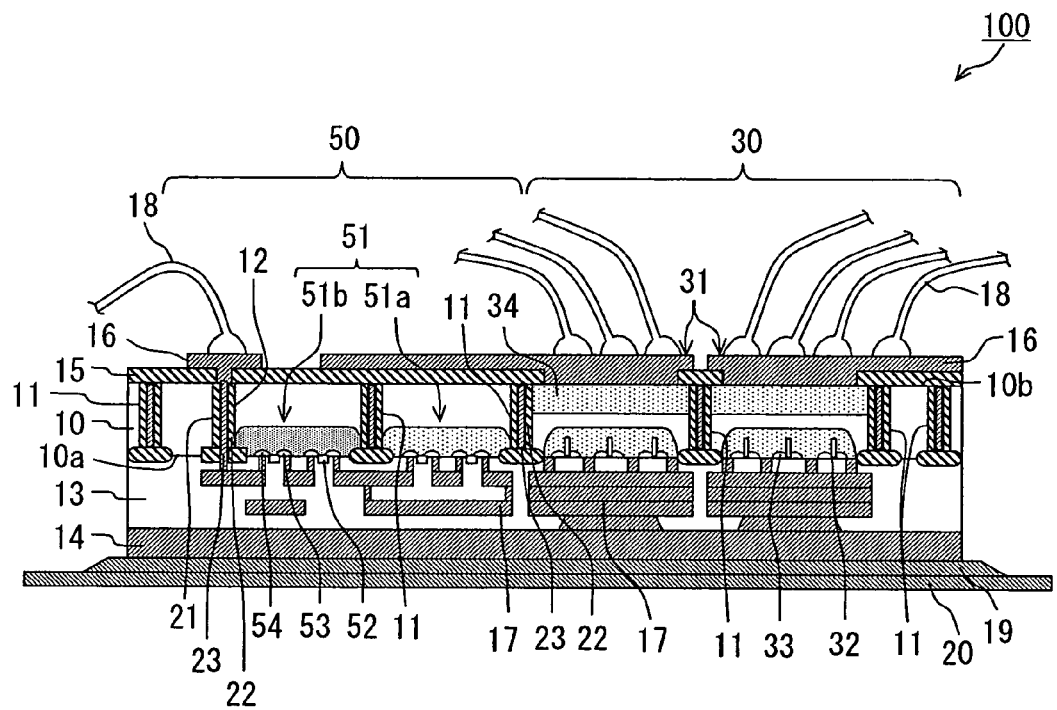
FIG. 1 is a cross-sectional view of a semiconductor device according to a first embodiment of the present invention.

As shown in FIG. 1, the semiconductor device 100 includes a semiconductor substrate 10, a power section 30, and a control section 50. The power section 30 and the control section 50 are formed in the semiconductor substrate 10. The power section 30 includes a plurality of vertical MOSFETs 31. The control section 50 includes a plurality of horizontal MOSFETs 51.

The semiconductor substrate 10 has a plurality of isolation trenches 11. The isolation trenches 11 divide the semiconductor substrate 10 into a plurality of element-forming regions that are electrically separated from each other. In each of the element forming regions, the vertical MOSFET 31 or the horizontal MOSFET 51 is formed. In the present embodiment, all the vertical MOSFETs 31 are N-channel type MOSFETs. The horizontal MOSFETs 51 are a complementary MOSFET including an N-channel type MOSFET 51a and a P-channel type MOSFET 51b.

The semiconductor substrate 10 has a first surface 10a and a second surface 10b opposing each other in a thickness direction of the semiconductor substrate 10. In the semiconductor substrate 10, a plurality of penetrating electrodes 12 that penetrates the semiconductor substrate 10 in the thickness direction from the first surface 10a to the second surface 10b are disposed. On the first surface 10a of the semiconductor substrate 10, a wiring layer 13 is disposed. The wiring layer 13 covers the whole area of the first surface 10a. On a surface of the wiring layer 13, a metal layer 14 is disposed. The metal layer 14 also covers the whole area of the first surface 10a. On the second surface 10b of the semiconductor substrate 10, an insulation layer 15 and a plurality of pads 16 are disposed. In a first surface portion of the semiconductor substrate 10 adjacent to the first surface 10a, gates 32 and sources 33 of the vertical MOSFETs 31, and gates 52, sources 53, drains 54 of the horizontal MOSFETs 51 are disposed. Thus, a PN junction part of each of the vertical MOSFETs 31 and the horizontal MOSFETs 51 is disposed in the first surface portion of the semiconductor substrate 10.

In the wiring layer 13, internal wires 17 are disposed. A first end of each of the penetrating electrodes 12 adjacent to the first surface 10a is electrically coupled with a corresponding one of the internal wires 17. A second end of each of the penetrating electrodes 12 adjacent to the second surface 10b is electrically coupled with a corresponding one of the pads 16. Each of the gates 52, the sources 53, and the drains 54 of the horizontal MOSFETs 51, which are disposed in the first surface portion of the semiconductor substrate 10, is electrically coupled with a corresponding one of the pads 16 through a corresponding one of the internal wires 17 and a corresponding one of the penetrating electrodes 12. On each of the pads 16, wires 18 are bonded. Thus, the horizontal MOSFETs 51 can be electrically coupled with an external device through the wires 18. The internal wires 17 directly coupled with the gates 52 can function as gate electrodes. The internal wires 17 directly coupled with the sources 53 can function as source electrodes 53. The internal wires 17 directly coupled with the drains 54 can function as drain electrodes. Thus, the source electrodes, the gate electrodes, and the drain electrodes of the horizontal MOSFETs 51 are disposed on the first surface 10*a* of the semiconductor substrate 10, and electric current flows between the source electrodes and the drain electrodes in a direction along the first surface 10*a*.

On the metal layer 14, a sheet of lead 20 is disposed through a die-bonding member 19. The die-bonding member 19 can function as a conductive adhesive. The lead 20 covers the whole area of the first surface 10*a*. The metal layer 14 is mechanically and electrically coupled with the lead 20 though the die-bonding member 19. Thus, each of the sources 33 of the vertical MOSFETs 31, which is disposed in the first surface portion of the semiconductor substrate 10, is electrically coupled with the lead 20 through a corresponding one of the internal wires 17, the metal layer 14, and the die-bonding member 19. The internal wires 17 directly coupled with the sources 33 can function as source electrodes.

Each of the isolation trenches 11 and the penetrating electrodes 12 has a trench 21 that penetrates the semiconductor substrate 10 from the second surface 10*b* and reaches to the wiring layer 13. Each of the trenches 21 of the isolation trenches 11 is formed into a tubular shape. Each of the trenches 21 of the penetrating electrodes 12 is formed into a tubular shape. Each of the isolation trenches 11 includes the trench 21, an insulation layer 22 disposed on a sidewall of the trench 21, and a conductive member 23 that fills a hollow portion surrounded by the insulation layer 22. Each of the penetrating electrodes 12 includes the trench 21, an insulation layer 22 disposed on a sidewall of the trench 21, and a conductive member 23 that fills a hollow portion surrounded by the insulating layer 22.

Although not shown in FIG. 1, a first end of each of the isolation trenches 11 adjacent to the first surface 10*a* is electrically coupled with a corresponding one of the internal wires 17 that is electrically coupled with a corresponding one of the gates 32 of the vertical MOSFETs 31, and a second end of each of the isolation trenches 11 adjacent to the second surface 10*b* is electrically coupled with a corresponding one of the pads 16. The wires 18 are electrically coupled with the pads 16. Thus, the vertical MOSFETs 31 can be electrically coupled with an external device through the wires 18. The internal wires 17 directly coupled with, the gates 32 can function as gate electrodes.

As shown in FIG. 1, the drains 34 of the vertical MOSFETs 31 formed on the second surface 10*b* of the semiconductor substrate 10 are directly coupled with a corresponding one of the pads 16 mechanically and electrically. The pads 16 directly coupled with the drains 34 can function as drain electrodes. Thus, the source electrodes and the gate electrodes of the vertical MOSFETs 31 are disposed on the first surface 10*a* of the semiconductor substrate 10, the drain electrodes of the vertical MOSFETS 31 are disposed on the second surface 10*a* of the semiconductor substrate 10, and electric current flows between the source electrodes and the drain electrodes in the thickness direction.

In FIG. 1 and FIG. 3A to FIG. 4D, in order to restrict complication, the internal wires 17 electrically coupled with the gates 32 of the vertical MOSFETs 31, the internal wires 17 electrically coupled with the gates 52 of the horizontal MOSFETs 51, and the penetrating electrodes 12 electrically coupled with the internal wires 17 that are electrically coupled with the gates 32 and the gates 52 are not illustrated.

Figure 2:
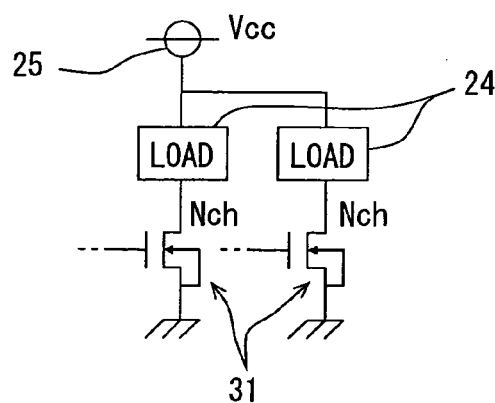
FIG. 2 is a circuit diagram of a circuit formed by a power section of the semiconductor device according to the first embodiment.

A circuit provided by the power section 30 will be described with reference to FIG. 2. Each of the sources 33 of the vertical MOSFETs 31 is electrically coupled with the lead 20 through the corresponding one of the internal layers 17, the metal layer 14, and the die-bonding member 19. Each of the drains 34 is electrically coupled with the corresponding wires 18 through the corresponding one of the pads 16. The lead 20 is coupled with the ground. The wires 18 electrically coupled with the drains 34 are electrically coupled with a power source 25 having a source voltage Vcc through loads 24. The vertical MOSFETs 31 disposed on the low side drive the loads 24.

An example of manufacturing process of the semiconductor device 100 according to the present embodiment will be described with reference to FIG. 3A to FIG. 4D. During a process shown in FIG. 3A, a semiconductor substrate 10 is prepared. Components of the vertical MOSFETs 31 and the horizontal MOSFETs 51 in the first surface portion of the semiconductor substrate 10, that is, the gates 32 and the sources 33 of the vertical MOSFETs 31 and the gates 52, the sources 53, and the drains 54 of the horizontal MOSFETs 51 are formed. Then, the wiring layer 13 and the metal layer 14 are stacked on the first surface 10*a*.

Figure 3A:
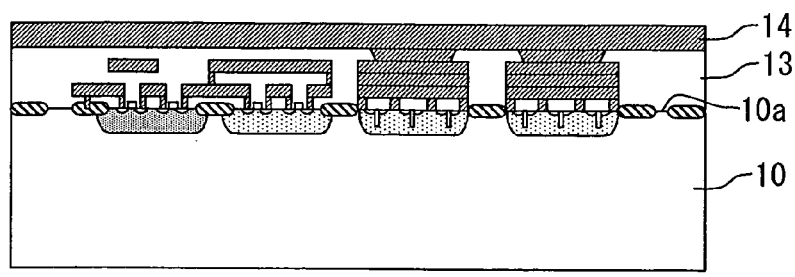
FIG. 3A to FIG. 3D are diagrams showing an example of manufacturing processes of the semiconductor device according to the first embodiment.
Figure 3B:
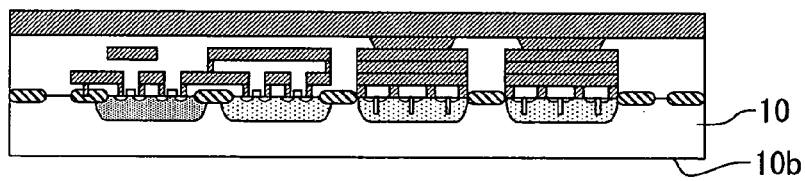

During a process shown in FIG. 3B, a thickness of the semiconductor substrate 10 is reduced to a predetermined thickness by grinding the semiconductor substrate 10 from the second surface 10*b*.

Figure 3C:
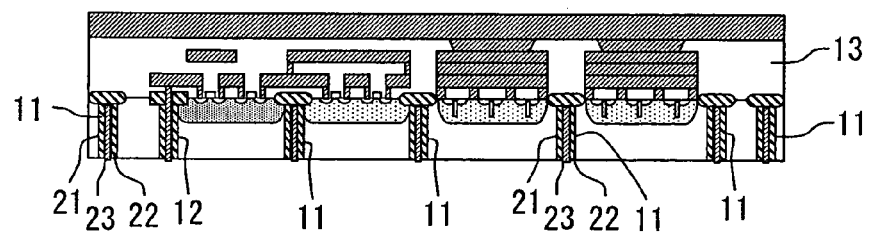

During a process shown in FIG. 3C, the trenches 21 are provided from the second surface 10*b* so as to reach the wiring layer 13. The sidewalls of the trenches 21 are thermally oxidized, thereby forming the insulation layers 22. Then, the hollow portion surrounded by the insulation layers 22 are filled with the conductive member 23, thereby forming the isolation trenches 11 and the penetrating electrodes 12.

Figure 3D:
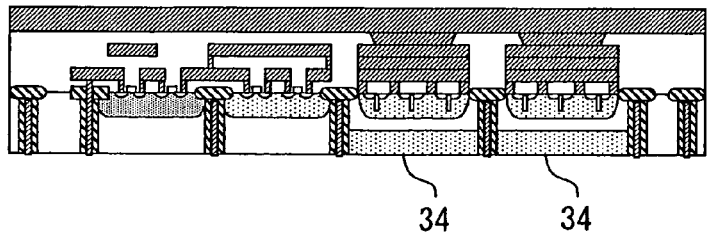

During a process shown in FIG. 3D, components of the vertical MOSFETs 31 in the second surface portion, that is, the drains 34 of the vertical MOSFETs 31 are formed by implanting impurities to the element-forming regions for the vertical MOSFETs 31.

Figure 4A:
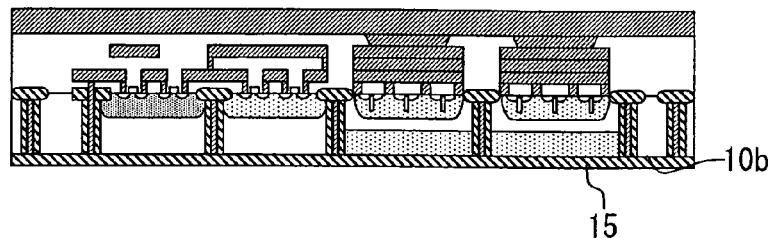
FIG. 4A to FIG. 4D are diagrams showing an example of manufacturing processes of the semiconductor device following the manufacturing processes shown in FIG. 3A to FIG. 3D.

During a process shown in FIG. 4A, the insulation layer 15 is formed on the second surface 10*b* of the semiconductor substrate 10 by a chemical vapor deposition (CVD) method.

Figure 4B:
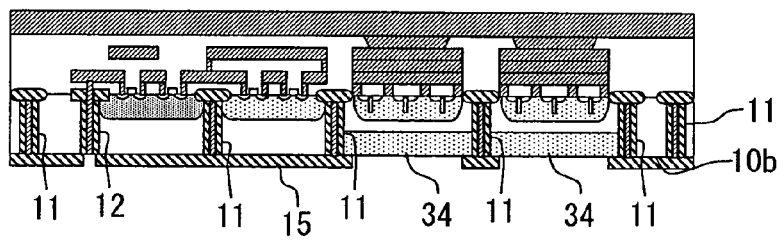

During a process shown in FIG. 4B, portions of the insulation layer 15 located just above the drains 34 and portions of the insulation layer 15 located just above the second ends of the isolation trenches 11 and the penetrating electrodes 12 that need to be electrically coupled are removed by a dry etching method. In FIG. 4B, portions of the insulation layer 15 located just above the second ends of the isolation trenches 11 are not removed because the second ends of the isolation trenches 11 that need to be electrically coupled are not shown in cross section shown in FIG. 4B. In different cross sections, the portions of the insulation layer 15 located just above the second ends of the isolation trenches 11 that need to be electrically coupled are removed.

Figure 4C:
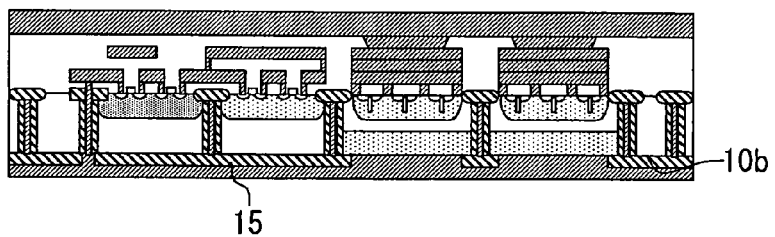

During a process shown in FIG. 4C, a metal layer is formed by a spattering method on the insulation layer 15 and portions of the second surface 10*b* exposed from opening portions of the insulation layer 15.

Figure 4D:
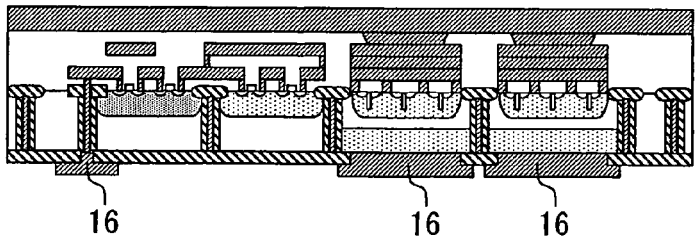
Figure 5A:
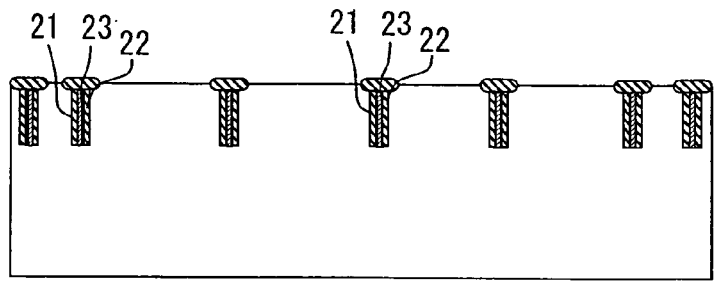
FIG. 5A to FIG. 5D are diagrams showing another example of manufacturing process of the semiconductor device according to the first embodiment.
Figure 5B:
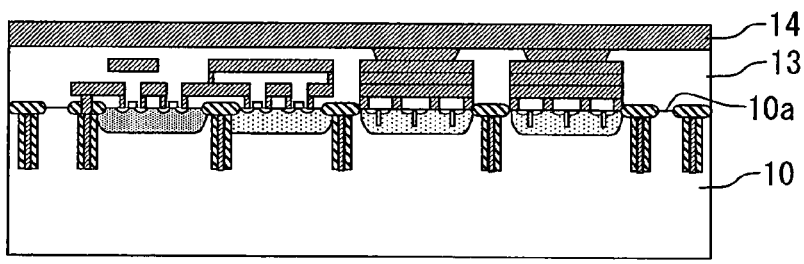
Figure 5C:
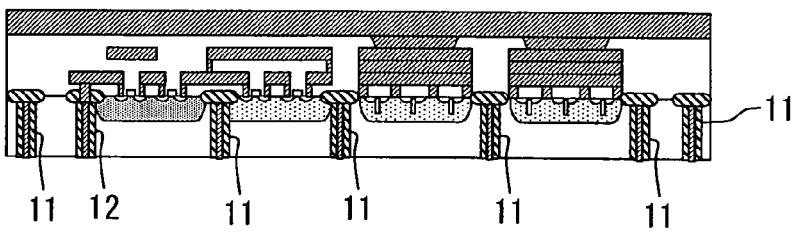
Figure 5D:
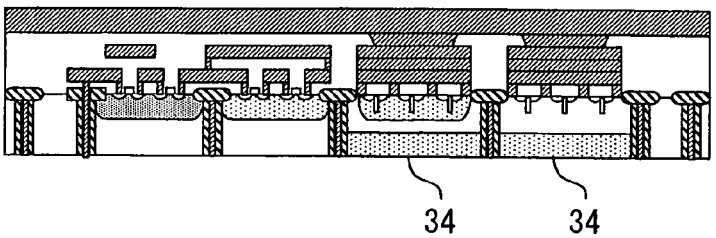

During a process shown in FIG. 4D, portions of the metal layer not required for electrical couplings are removed by a dry etching method, thereby forming the pads 16.

After forming the pads 16, the metal layer 14 and the lead 20 are mechanically and electrically coupled through the die-bonding member 19, and the wires 18 are bonded to the pads 16. The semiconductor device 100 shown in FIG. 1 can be formed by the above-described method.

The order of manufacturing processes is not limited to the above-described example. For example, the semiconductor device 100 can also be formed through manufacturing processes shown in FIG. 5A to FIG. 5D. During a process shown in FIG. 5A, the isolation trenches 11 and the penetrating electrodes 12 are formed. During a process shown in FIG. 5B, the components of the vertical MOSFETs 31 and the horizontal MOSFETs 51 in the first surface portion of the semiconductor substrate 10, the wiring layer 13, and the metal layer 14 are formed. During a process shown in FIG. 5C, the thickness of the semiconductor substrate 10 is reduced to the predetermined thickness from the second surface 10b. During a process shown in FIG. 5D, the drains 34 are formed by implanting impurities. The manufacturing processes shown in FIG. 5A to FIG. 5D are different from the manufacturing processes shown in FIG. 3A to FIG. 3D in that the trenches 21 are provided first. After the manufacturing processes shown in FIG. 5A to FIG. 5D, the manufacturing processes shown in FIG. 4A to FIG. 4D are carried out, thereby forming the semiconductor device 100 shown in FIG. 1. During the process shown in FIG. 5A, the trenches 21 are provided from the first surface 10a of the semiconductor substrate 10 to a predetermined depth, the insulation layers 22 are formed on the sidewalls of the trenches 21, and at least one of the hollow portions surrounded by the insulation layers 22 are filled with the conductive member 23.

In the manufacturing processes shown in FIG. 3A to FIG. 3D, when the isolation trenches 11 and the penetrating electrodes 12 are formed, the components of the vertical MOSFETs 31 and the horizontal MOSFETs 51 in the first surface portion of the semiconductor substrate 10 have already been formed. Thus, as a material of the conductive member 23, metal (for example, copper) that has a lower resistance than doped polysilicon can be used. Therefore, the semiconductor device 100 formed through the manufacturing processes shown in FIG. 3A to FIG. 3D can reduce resistances of the isolation trenches 11 and the penetrating electrodes 12 compared with the semiconductor device 100 formed though the manufacturing processes shown in FIG. 5A to FIG. 5D, and heat generation of the semiconductor device 100 can be reduced. Furthermore, in the manufacturing processes shown in FIG. 3A to FIG. 3D, when the thickness of the semiconductor substrate 10 is reduced, the isolation trenches 11 and the penetrating electrodes 12 has not been formed in the semiconductor substrate 10. Thus, the thickness of the semiconductor substrate 10 can be easily controlled. On the other hand, in the manufacturing processes shown in FIG. 5A to FIG. 5D, the semiconductor substrate 10 has a sufficient thickness when the isolation trenches 11 and the penetrating electrodes 12 are formed. Thus, the trenches 21 can be easily provided.

In the semiconductor device 100 according to the present embodiment, the PN junction parts of the vertical MOSFETs 31 and the horizontal MOSFETs 51 are formed in the first surface portion of the semiconductor substrate 10. Each of the gates 52, the sources 53, and the drains 54 of the horizontal MOSFETs 51 formed in the first surface portion of the semiconductor substrate 10 are electrically coupled with the corresponding one of the pads 16 on the second surface 10b through the corresponding one of the internal wires 17 and the corresponding one of the penetrating electrodes 12. In addition, each of the gates 32 of the vertical MOSFETs 31 formed in the first surface portion of the semiconductor substrate 10 are electrically coupled with the corresponding one of the pads 16 on the second surface 10b through the corresponding one of the internal wires 17 and the corresponding one of the isolation trenches 11. Thus, the PN junction parts of the vertical MOSFETs 31 and the horizontal MOSFETs 51 formed in the first surface portion of the semiconductor substrate 10 can be restricted from being applied with stress during bonding the wires 18, and influence the stress to electric properties of the vertical MOSFETs 31 and the horizontal MOSFETs 51 can be restricted. The stress during bonding the wires 18 is applied to the drains 34 of the vertical MOSFETs 31 formed in the second surface portion of the semiconductor substrate 10. However, because a PN junction part is not formed in the second surface portion of the semiconductor substrate 10, the electric properties of the vertical MOSFETs 31 are difficult to change due to the stress.

The gates 32, 52 are formed in the first surface portion of the semiconductor substrate 10, and gate insulation layers that electrically separate the semiconductor substrate 10 from the gates 32, 52 are formed in the first surface side portion of the semiconductor substrate 10. In general, a thickness of the gate insulation layers is thin. Thus, if the gate insulation layers are applied with the stress at bonding the wires 18, insulation between the gates 32, 52 and the semiconductor substrate 10 may be reduced, and the electric properties of the vertical MOSFETs 31 and the horizontal MOSFETs 51 may change. However, in the semiconductor device 100 according to the present embodiment, the stress during bonding the wires 18 is applied to the second surface 10b of the semiconductor substrate. Thus, the insulation of the gate insulation layers is not easily reduced, and the electric properties of the vertical MOSFETs 31 are difficult to change due to the stress.

The lead 20 is disposed to the first surface 10a of the semiconductor substrate 10 through the die-bonding member 19 and the metal layer 14 and covers the whole area of the first surface 10a. Because the lead 20 is not divided, a heat radiation performance of the lead 20 is not reduced. Because the lead 20 does not need to be processed to have a complicated shape, a processing cost of the lead 20 can be saved. Furthermore, a contact area of the metal layer 14 and the lead 20 is large, the heat radiation performance can be improved.

The isolation trenches 11 are formed by forming the insulation layers 22 on the sidewalls of the trenches 21 and filling the hollow portions surrounded by the insulation layers 22 with the conductive member 23. The first ends of the isolation trenches 11 adjacent to the first surface 10a are electrically coupled with the internal wires 17 that are electrically coupled with the gates 32 of the vertical MOSFETs 31. The second ends of the isolation trenches 11 adjacent to the second surface 10b are electrically coupled with the pads 16. Because the isolation trenches 11 can function as the penetrating electrodes 12, the number of the penetrating electrodes 12 can be reduced. Thus, a dimension of the semiconductor device 100 can be reduced.

The penetrating electrodes 12 can be formed in the same manufacturing process as the isolation trenches 11. Thus, an additional process for forming the penetrating electrodes 12 is not required, and a manufacturing cost can be reduced.

The sources 33 of the vertical MOSFETs 31 are electrically coupled with the lead 20 though the internal wires 17, the metal layer 14, and the die-bonding member 19, and the lead 20 is coupled with the ground. All the vertical MOSFETs 31 are electrically common. Thus, compared with a case where the vertical MOSFETs 31 are electrically different, the numbers of internal wires 17, the penetrating electrodes 12, and the pads 16 can be reduced.

The pads 16 can function as wire-bonding pads. The die-bonding member 19 can function as a conductive adhesive. The isolation trenches 11 can function as conductive trenches. The internal wires 17 directly coupled with the gates 32, 52, the sources 33, 53 and the drains 54 and the pads 16 directly coupled with the drains 34 can function as the electrodes.

Second Embodiment

A semiconductor device 100 according to a second embodiment of the present invention will be described with reference to FIG. 6 and FIG. 7.

Because the semiconductor device 100 according to the present embodiment have many portions in common with the semiconductor device 100 according to the first embodiment, a description of the common portions will be omitted and different portions will be mainly described. In the following description, the same reference numbers are given to components same as the components described in the first embodiment. The control section 50 in the semiconductor device 100 according to the present embodiment is similar to the control section 50 in the semiconductor device 100 according to the first embodiment. Thus, a description of the control section 50 will be omitted.

In the semiconductor device 100 according to the present embodiment, the vertical MOSFETs 31 are a complementary MOSFET including an N-channel type MOSFET 31$a$ and a P-channel type MOSFET 31$b$.

The N channel type MOSFET 31$a$ and the P channel type MOSFET 31$b$ configurate a half-bridge circuit.

Figure 6:
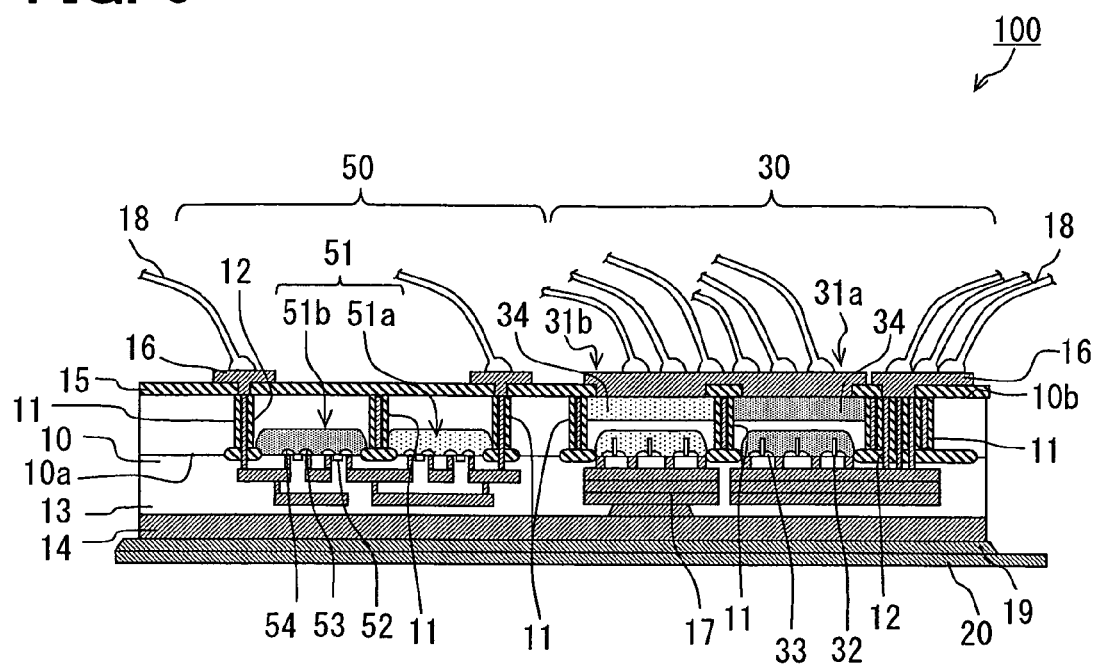
FIG. 6 is a cross-sectional view of a semiconductor device according to a second embodiment of the present invention.
Figure 7:
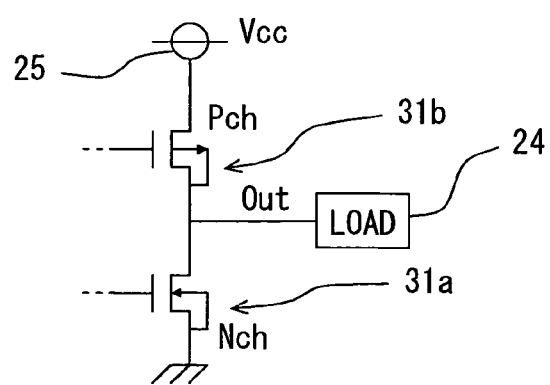
FIG. 7 is a circuit diagram of a circuit formed by a power section of the semiconductor device according to the second embodiment.

The N-channel type MOSFET 31$a$ and the P-channel type MOSFET 31$b$ are formed in the semiconductor substrate 10 as shown in FIG. 6. In the first surface portion of the semiconductor substrate 10 adjacent to the first surface 10$a$, a gate 32$a$ and a source 33$a$ of the N-channel type MOSFET 31$a$ and a gate 32$b$ and a source 33$b$ of the P-channel type MOSFET 31$b$ are formed. In the second surface portion of the semiconductor substrate 10 adjacent to the second surface 10$b$, a drain 34$a$ of the N-channel type MOSFET 31$a$ and a drain 34$b$ of the P-channel type MOSFET 31$b$ are formed.

The source 33$a$ of the N-channel type MOSFET 31$a$ is electrically coupled with the lead 20 through corresponding one of the internal wires 17, the metal layer 14, and the die-bonding member 19. The lead 20 is coupled with the ground. Thus, the source 33$a$ of the N-channel type MOSFET 31$a$ is coupled with the ground.

The drain 34$a$ of the N-channel type MOSFET 31$a$ and the drain 34$b$ of the P-channel type MOSFET 31$b$ are electrically coupled with each other through one of the pads 16. Thus, the N-channel type MOSFET 31$a$ and P-channel type MOSFET 31$b$ are coupled in series.

The source 33$b$ of the P-channel type MOSFET 31$b$ is electrically coupled with the wires 18 through a corresponding one of the internal wires 17, a corresponding one of the penetrating electrodes 12, and a corresponding one of the pads 16: The wires 18 are coupled with the power source 25. Thus; the source 33$b$ of the P-channel type MOSFET 31.$b$ is coupled with the power source 25.

The N-channel type MOSFET 31$a$ and the P-channel type MOSFET 31$b$ are coupled in series between the power source 25 and the ground, thereby configuring the half-bridge circuit.

In the semiconductor device 100 shown in FIG. 6, the vertical MOSFETs 31 are the complementary MOSFET including the N-channel type MOSFET 31$a$ and the P-channel type MOSFET 31$b$. Also when both of the vertical MOSFETs 31 are the N-channel type MOSFETs, a half-bridge circuit can be formed. A semiconductor device 100 according to a modification of the second embodiment will be described with reference to FIG. 8 and FIG. 9. In the semiconductor device 100 shown in FIG. 8, the source 33 of one of the vertical MOSFETs 31 is electrically coupled with the lead 20 through a corresponding one of the internal wires 17, the metal layer 14, and the die-bonding member 19. The drain 34 of the one of the vertical MOSFETs 31 is electrically coupled with the source 33 of the other one of the vertical MOSFETs 31 through a corresponding one of the pads 16, the corresponding penetrating electrodes 12, and the corresponding internal wires 17. The drain 34 of the other one of the vertical MOSFETs 31 is electrically coupled with the wires 18 through a corresponding one of the pads 16. The lead 20 is coupled with the ground. The wires 18 electrically coupled with the drain 34 of the other one of the vertical MOSFETs 31 are coupled with the power source 25. Thus, the two N-channel type vertical MOSFETs 31 are coupled in series between the power source 25 and the ground, thereby configuring a half-bridge circuit shown in FIG. 9.

Third Embodiment

A semiconductor device 100 according to a third embodiment of the present invention will be described with reference to FIG. 10 and FIG. 11.

Because the semiconductor device 100 according to the present embodiment has many portions in common with the semiconductor device 100 according to the first embodiment or the semiconductor device 100 according to the second embodiment, a description of the common portions will be omitted and different portions will be mainly described. In the following description, the same reference numerals are given to components same as the components described in the first embodiment and the second embodiment. The control section 50 in the semiconductor device 100 according to the present embodiment is similar to the control section 50 in the semiconductor device 100 according to the first embodiment. Thus, a description of the control section 50 will be omitted.

The semiconductor device 100 according to the present embodiment includes three pairs of N-channel type MOSFET 31$a$ and P-channel type MOSFET 31$b$, and each pair configurates the half-bridge circuit described in the second embodiment. The three pairs of N-channel type MOSFET 31$a$ and P-channel type MOSFET 31$b$ configurates a three-phase inverter circuit.

Each source 33$a$ of the three N-channel type MOSFETs 31$a$ is coupled with the ground in common with each other. Each source 33$b$ of the three P-channel type MOSFETs 31$b$ is coupled with the power source 25 in common with each other. Each drain 34$a$ of the three N-channel type MOSFETs 31$a$ and each drain 34$b$ of the three P-channel type MOSFETs 31$b$ are coupled with a three-phase motor 36.

Figure 11:
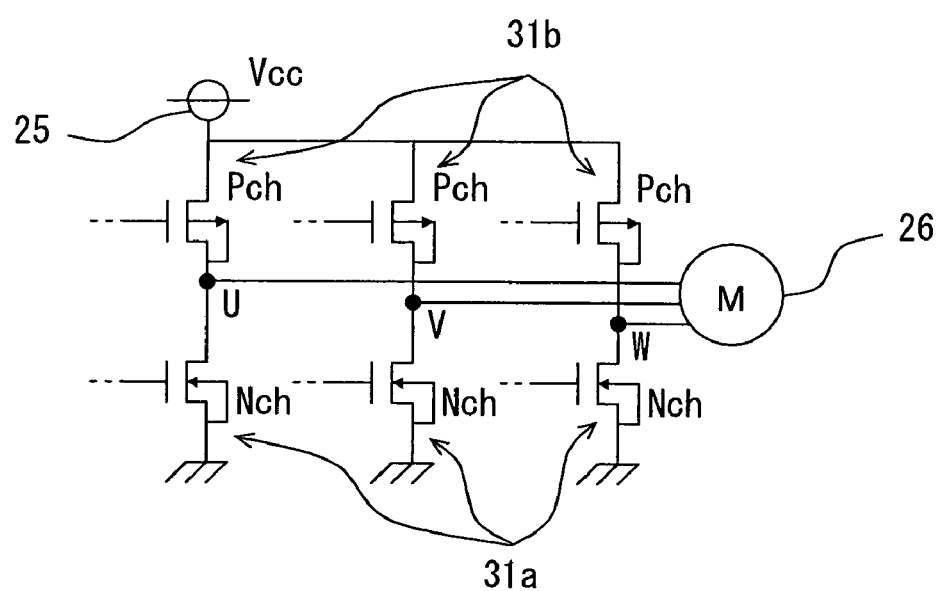
FIG. 11 is a circuit diagram of a circuit formed by the power section of the semiconductor device according to the third embodiment.

Thus, the three pairs of N-channel type MOSFET 31$a$ and P-channel type MOSFET 31$b$ configurates the three-phase inverter circuit as shown in FIG. 11.

Figure 8:
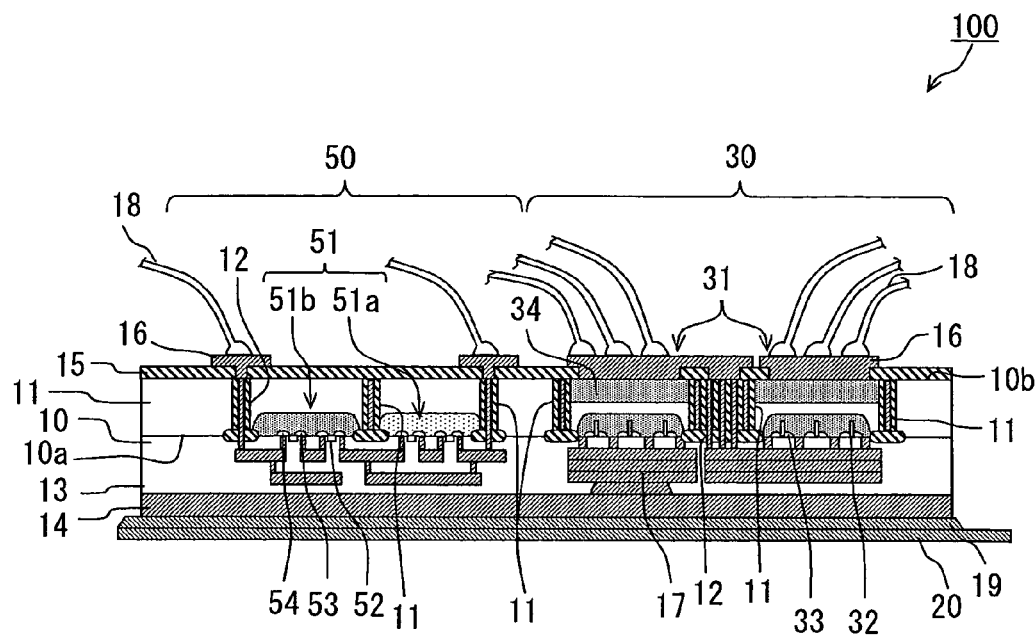
FIG. 8 is a cross-sectional view of a semiconductor device according to a modification of the second embodiment.
Figure 9:
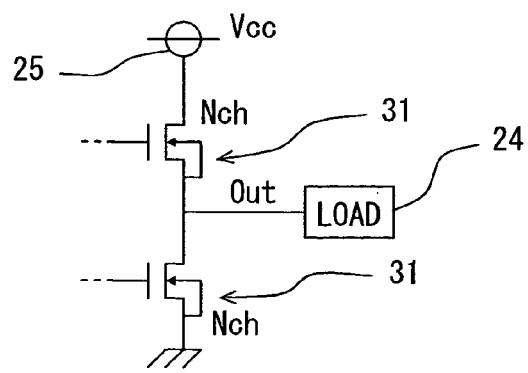
FIG. 9 is a circuit diagram of a circuit formed by a power section of the semiconductor device according to the modification of the second embodiment.
Figure 10:
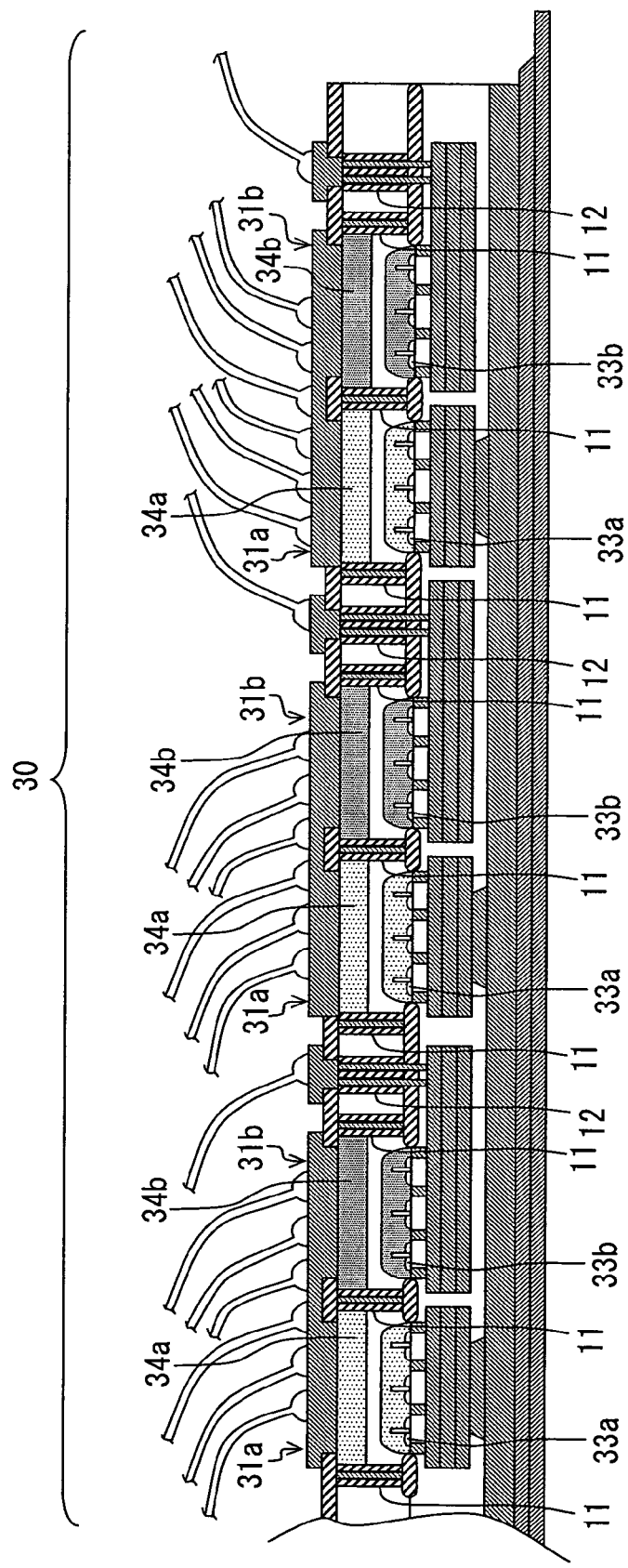
FIG. 10 is a cross-sectional view of a power section of a semiconductor device according to a third embodiment of the present invention.
Figure 12:
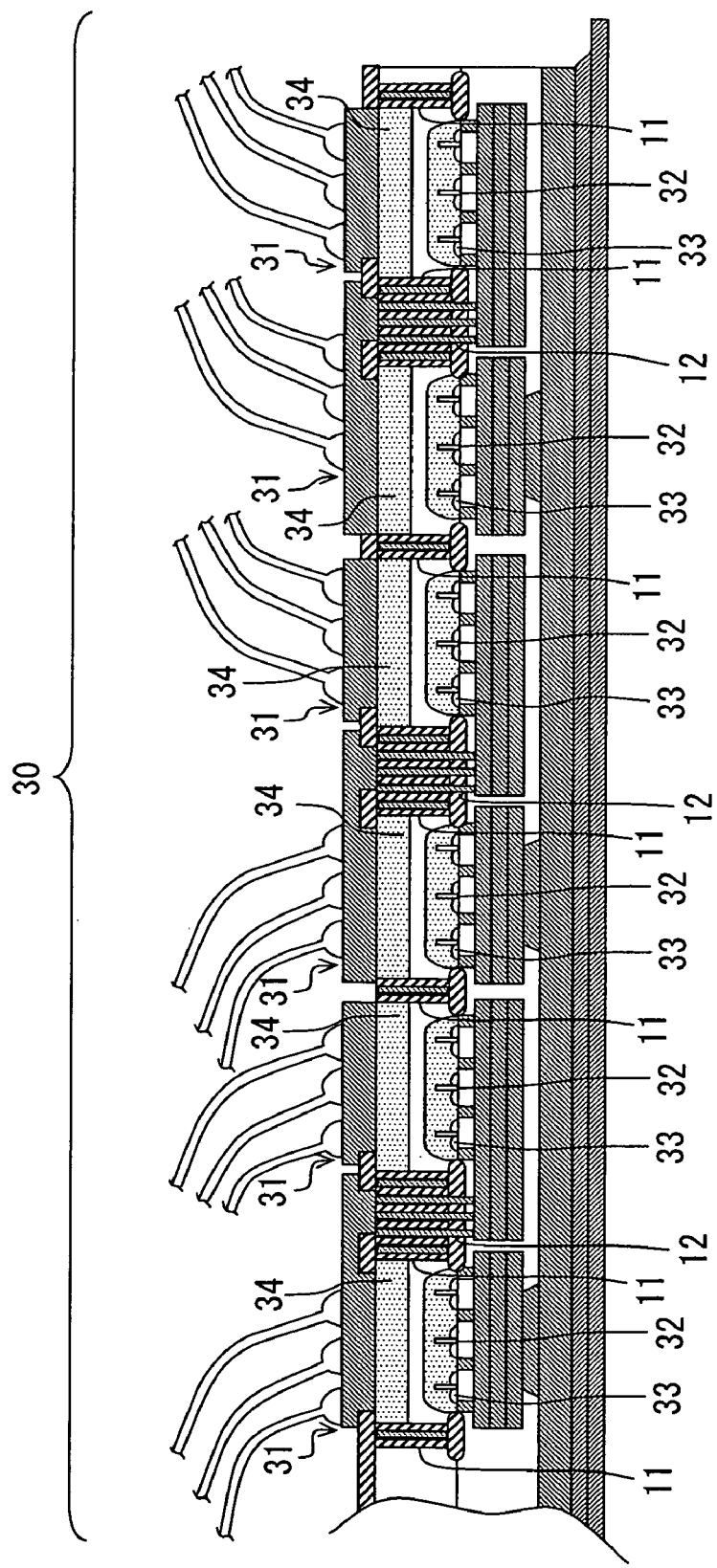
FIG. 12 is a cross-sectional view of a power section of a semiconductor device according a modification of the third embodiment.
Figure 13:
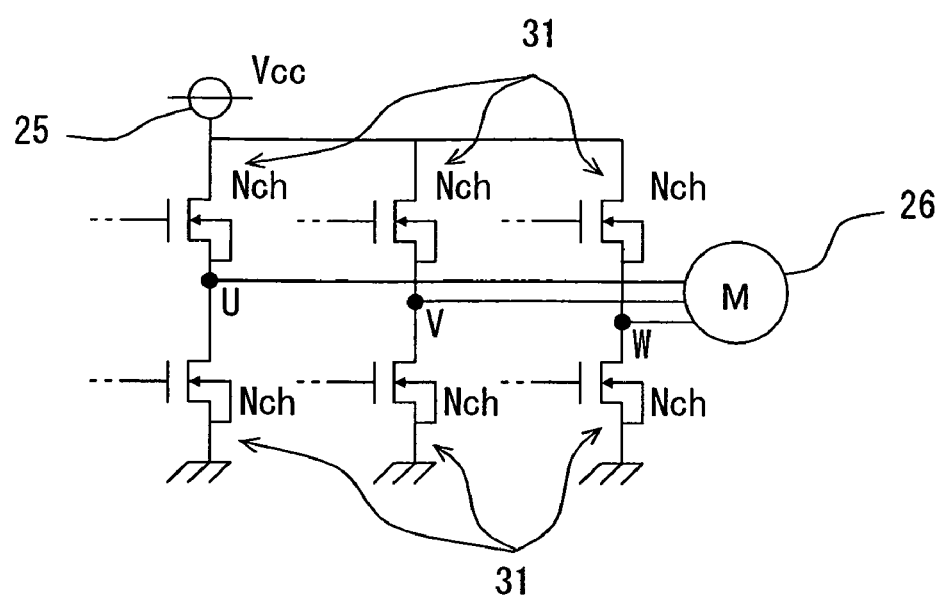
FIG. 13 is a circuit diagram of a circuit formed by the power section of the semiconductor device according to the modification of the third embodiment.

In the semiconductor device 100 shown in FIG. 10, the vertical MOSFETs 31 includes the three N-channel type MOSFETs 31$a$ and the three P-channel type MOSFETs 31$b$. Also when all the vertical MOSFETs 31 are the N-channel type MOSFETs, a three-phase can be formed. A semiconductor device 100 according to a modification of the third embodiment will be described with reference to FIG. 12 and FIG. 13. The semiconductor device 100 includes three pairs of N-channel type vertical MOSFETs 31, and each pair configurates the half-bridge circuit as shown in FIG. 8. The three pairs of vertical MOSFETs 31 configurates a three-phase inverter circuit.

Other Embodiments

Although the present invention has been fully described in connection with the exemplary embodiments thereof with reference to the accompanying drawings, it is to be noted that various changes and modifications will become apparent to those skilled in the art.

In the semiconductor devices 100 according to the first to third embodiments, each of the isolation trenches 11 includes the trench 21, the insulation layer 22, and the conductive member 23. In a case where the isolation trenches 11 are required only to isolate the element-forming regions, each of the isolation trenches 11 may include only the trench 21 or each of the isolation trenches 11 may include only the trench 21 and the insulation layer 22. Needless to say, a part of the isolation trenches 11 may include the trench 21, the insulation layer 22, and the conductive member 23 and the other part of the isolation trenches 11 may include only the trench 21 or a part of the isolation trenches 11 may include the trench 21, the insulation layer 22, and the conductive member 23 and the other part of the isolation trench 11 may include only the trench 21 and the insulation layer 22.

In each of the semiconductor device 100 according to the first to third embodiments, the lead 20 fixed to the semiconductor substrate 10 may be disposed on a circuit substrate, and the semiconductor substrate 10, the lead 20, and the circuit substrate and may be sealed with a molded member. For example, when a lead coupled with the semiconductor substrate 10 is divided, a clearance is provided between the divided leads and the strength of a semiconductor device is locationally low at the clearance. If a semiconductor device has a portion at which the strength is low, that is, the clearance, when a semiconductor substrate and a circuit substrate are sealed with a molded member, a stress concentration may occur at the portion where the strength is low. In order to solve the above-described difficulty, the clearance between the divided leads may be filled with underfill material so as to be reinforced. However, when the clearance between the divided leads is filled with underfill material, the number of manufacturing process and the number of parts increase.

In the semiconductor devices 100 according to the first to third embodiments, the sheet of lead 20 is disposed to the first surface 10a of the semiconductor substrate 10 and covers the whole area of the first surface 10a. Thus, a portion at which the strength is locationally low is not formed in the semiconductor devices 100 according to the first to third embodiments. Therefore, when the semiconductor substrate 10 and a circuit substrate is sealed with a molded member, the semiconductor devices 100 are not required to be reinforced with underfill material. Therefore, the manufacturing cost can be reduced compared with a semiconductor device in which a lead is divided.

In the semiconductor devices 100 according to the first to third embodiments, the vertical MOSFET 31 is disposed as an example of a vertical transistor and the horizontal MOSFET 51 is disposed as an example of a horizontal transistor. However, transistors disposed in the semiconductor devices 100 are not limited to MOSFETs. For example, an insulated gate bipolar transistor (IGBT) may also be formed as an example of the transistor.

What is claimed is:

1. A semiconductor device comprising:
a semiconductor substrate having a first surface and a second surface opposing each other in a thickness direction of the semiconductor substrate, the semiconductor substrate including a first surface portion adjacent to the first surface and a second surface portion adjacent to the second surface;
a plurality of isolation trenches dividing the semiconductor substrate into a plurality of element-forming regions;
a vertical transistor disposed in one of the plurality of element-forming regions, the vertical transistor including a first electrode, a second electrode, and a third electrode, the first electrode and the second electrode disposed on the first surface and the third electrode disposed on the second surface so that electric current flows between the first electrode and the third electrode in the thickness direction, the vertical transistor further including a PN junction part in the first surface portion;
a horizontal transistor disposed in another one of the plurality of element-forming regions, the horizontal transistor including a first electrode, a second electrode, and a third electrode, the first electrode, the second electrode, and the third electrode disposed on the first surface so that electric current flows between the first electrode and the third electrode in a direction along the first surface, the horizontal transistor further including a PN junction part in the first surface portion;
a sheet of lead disposed to the first surface and covering the whole area of the first surface;
a plurality of wire-bonding pads disposed on the second surface;
a plurality of wires bonded to the plurality of wire-bonding pads disposed on the second surface; and
a plurality of penetrating electrodes penetrating the semiconductor substrate in the thickness direction, wherein
the first electrode of the vertical transistor is electrically coupled with the sheet of lead, and
each of the second electrode of the vertical transistor, the first electrode, the second electrode, and the third electrode of the horizontal transistor is electrically coupled with a corresponding one of the plurality of wire-bonding pads through a corresponding one of the plurality of penetrating electrodes.

2. The semiconductor device according to claim 1, further comprising:
a metal layer disposed between the first surface and the sheet of lead and covering the whole area of the first surface; and
a conductive adhesive disposed between the metal layer and the sheet of lead and electrically coupling the metal layer and the sheet of lead.

3. The semiconductor device according to claim 1, wherein:
the plurality of isolation trenches includes a conductive trench;
the conductive trench includes a trench penetrating the semiconductor substrate in the thickness direction, an insulation layer disposed on a sidewall of the trench, and a conductive member disposed in the trench through the insulation layer;
each of the plurality of penetrating electrodes includes a trench penetrating the semiconductor substrate in the thickness direction, an insulation layer disposed on a sidewall of the trench, and a conductive member disposed in the trench through the insulation layer; and
the plurality of penetrating electrodes includes the conductive trench.

4. The semiconductor device according to claim 1, further comprising:
a circuit substrate on which the sheet of lead fixed to the semiconductor substrate is disposed; and
a molded member covering the semiconductor substrate, the sheet of lead, and the circuit substrate.

5. The semiconductor device according to claim 1, further comprising
another vertical transistor disposed in another one of the plurality of element-forming regions, the another vertical transistor including a first electrode, a second electrode, and a third electrode, the first electrode and the second electrode disposed on the first surface and the third electrode disposed on the second surface so that electric current flows between the first electrode and the third electrode in the thickness direction, the another vertical transistor further including a PN junction part in the first surface portion, the first electrode electrically coupled with the sheet of lead.

6. The semiconductor device according to claim 1, further comprising
another vertical transistor disposed in another one of the plurality of element-forming regions, the another vertical transistor including a first electrode, a second electrode, and a third electrode, the first electrode and the second electrode disposed on the first surface and the third electrode disposed on the second surface so that electric current flows between the first electrode and the third electrode in the thickness direction, the vertical transistor further including a PN junction part in the first surface portion, wherein
the vertical transistor and the another vertical transistor have different channel types, and
the vertical transistor and the another vertical transistor are coupled in series and configured as a half-bridge circuit.

7. The semiconductor device according to claim 1, further comprising
another vertical transistor disposed in another one of the plurality of element-forming regions, the another vertical transistor including a first electrode, a second electrode, and a third electrode, the first electrode and the second electrode disposed on the first surface and the third electrode disposed on the second surface so that electric current flows between the first electrode and the third electrode in the thickness direction, the another vertical transistor further including a PN junction part in the first surface portion, wherein
the vertical transistor and the another vertical transistor have the same channel type, and
the vertical transistor and the another vertical transistor are coupled in series and configured as a half-bridge circuit.

8. The semiconductor device according to claim 7, further comprising two additional half-bridge circuits, wherein
the three half-bridge circuits are configured as a three-phase inverter circuit.

9. The semiconductor device according to claim 1, wherein:
the vertical transistor is a vertical MOSFET, the first electrode of the vertical transistor is a source electrode, the second electrode of the vertical transistor is a gate electrode, and the third electrode of the vertical transistor is a drain electrode; and
the horizontal transistor is a horizontal MOSFET, the first electrode of the horizontal transistor is a source electrode, the second electrode of the horizontal transistor is a gate electrode, and the third electrode of the horizontal transistor is a drain electrode.

10. The semiconductor device according to claim 9, wherein:
the vertical transistor further includes a source and a gate disposed in the first surface portion and a drain disposed in the second surface portion; and
the horizontal transistor further includes a source, a gate, and a drain disposed in the first surface portion.

11. A semiconductor device, comprising:
a semiconductor substrate having a first surface and a second surface opposing each other in a thickness direction of the semiconductor substrate, the semiconductor substrate including a first surface portion adjacent to the first surface and a second surface portion adjacent to the second surface;
a plurality of isolation trenches dividing the semiconductor substrate into a plurality of element-forming regions;
a vertical transistor disposed in one of the plurality of element-forming regions, the vertical transistor including a first electrode, a second electrode, and a third electrode, the first electrode and the second electrode disposed on the first surface and the third electrode disposed on the second surface so that electric current flows between the first electrode and the third electrode in the thickness direction, the vertical transistor further including a PN junction part in the first surface portion;
a horizontal transistor disposed in another one of the plurality of element-forming regions, the horizontal transistor including a first electrode, a second electrode, and a third electrode, the first electrode, the second electrode, and the third electrode disposed on the first surface so that electric current flows between the first electrode and the third electrode in a direction along the first surface, the horizontal transistor further including a PN junction part in the first surface portion;
a sheet of lead disposed to the first surface and covering the whole area of the first surface;
a plurality of wire-bonding pads disposed on the second surface; and
a plurality of penetrating electrodes penetrating the semiconductor substrate in the thickness direction, wherein
the first electrode of the vertical transistor is electrically coupled with the sheet of lead,
each of the second electrode of the vertical transistor, the first electrode, the second electrode, and the third electrode of the horizontal transistor is electrically coupled with a corresponding one of the plurality of wire-bonding pads through a corresponding one of the plurality of penetrating electrodes,
the semiconductor device further comprises another vertical transistor disposed in another one of the plurality of element-forming regions, the another vertical transistor including a first electrode, a second electrode, and a third electrode, the first electrode and the second electrode disposed on the first surface and the third electrode disposed on the second surface so that electric current flows between the first electrode and the third electrode in the thickness direction, the vertical transistor further including a PN junction part in the first surface portion,
the vertical transistor and the another vertical transistor have the same channel type, and
the vertical transistor and the another vertical transistor are coupled in series and are configured as a half-bridge circuit, and
the semiconductor device comprises two additional half-bridge circuits, the three half-bridge circuits being configured as a three-phase inverter circuit.

* * * * *